(12) United States Patent
Jang et al.

(10) Patent No.: US 6,620,745 B2
(45) Date of Patent: Sep. 16, 2003

(54) METHOD FOR FORMING A BLOCKING LAYER

(75) Inventors: Syan-Mang Jang, Hsin-Chu (TW); Tien-I Bao, Hsin-chu (TW); Lain-Jong Li, Hualien (TW); Shwang-Ming Jeng, Hsin-chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 101 days.

(21) Appl. No.: 10/051,589

(22) Filed: Oct. 19, 2001

(65) Prior Publication Data

US 2003/0077887 A1 Apr. 24, 2003

(51) Int. Cl.[7] ................................. H01L 21/31
(52) U.S. Cl. ......................... 438/787; 438/765
(58) Field of Search ..................... 438/765, 553, 438/695, 787–788, 778

(56) References Cited

U.S. PATENT DOCUMENTS 6,066,577 A * 5/2000 Cooney et al. ............. 438/787
6,127,285 A * 10/2000 Nag ............................ 438/788
6,413,879 B1 * 7/2002 Maeda ....................... 438/758

* cited by examiner

Primary Examiner—David Nelms
Assistant Examiner—David Vu
(74) Attorney, Agent, or Firm—Tung & Associates

(57) ABSTRACT

A method is provided for forming a blocking layer in a multilayer semiconductor device for blocking diffusion of a chemical species including the steps of providing an insulating layer including a target surface for forming a metal nitride layer thereon said insulating layer forming a portion of a multilayer semiconductor device; treating the target surface with an RF generated plasma to cause a density increase over a thickness adjacent to and including a target surface sufficient to reduce a diffusion rate of chemical species therethrough; forming at least one metal nitride layer over the target surface; and, carrying out a photolithographic process wherein the surface of the at least one metal nitride layer is patterned for etching.

20 Claims, 1 Drawing Sheet

METHOD FOR FORMING A BLOCKING LAYER

FIELD OF THE INVENTION

This invention generally relates to methods for forming blocking layers and more particularly to a method for forming a blocking layer to reduce a diffusion rate of a chemical species thereby improving a photolithographic process.

BACKGROUND OF THE INVENTION

In semiconductor fabrication, various layers of insulating material, semiconducting material and conducting material are formed to produce a multilayer semiconductor device.

Since the introduction of semiconductor devices, the size of semiconductor devices has been continuously shrinking, resulting in smaller semiconductor chip size and increased device density on the chip. One of the limiting factors in the continuing evolution toward the smaller device size and higher density has been the interconnect area needed to route interconnect lines between devices. As a way to overcome such limitation, multilayer interconnection systems with increasingly smaller features have been implemented using shared interconnect lines between two or more layers.

The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, photolithography, etching, and planarization.

One such process for forming a series of interconnected multiple layer devices, for example, is a damascene or dual damascene process. Although there are several different manufacturing methods for manufacturing damascene structures, all such methods employ a series of photolithographic masking and etching steps, typically by a reactive ion etch (RIE). One exemplary process, for example, is known in the art as a via-first-trench last process. Typically a conventional photolithographic process using a photoresist layer is first used to pattern and expose an etching mask which is used for etching via openings through an insulating inter-metal dielectric (IMD) layer. Subsequently a similar process is used to define trench openings for metal interconnect lines in an insulating metallization layer that are formed substantially over the via openings. The via opening and trench openings are subsequently filled with metal to form metallization vias and metal interconnect lines, respectively. The surface may then be planarized by conventional techniques, such as chemical mechanical polishing (CMP) to better define the metal interconnect lines and prepare the substrate for further processing.

Referring to FIG. 1, typically, an insulating layer (IMD) 12 layer is formed over a metallization layer 10. Prior to forming the IMD layer 12, an etch stop layer 14A, for example, silicon nitride (SiN) or silicon carbide (SiC) is formed over the metallization layer 10. Another etch layer stop layer 14B is then formed over IMD layer 12. Prior to forming via openings 18A, 18B, and 18C, dielectric anti-reflective coating (DARC) layer 16 is formed over the etching stop layer 14B prior to depositing a photoresist coating 20 for carrying out a photolithographic process used for patterning and subsequently etching by, for example, a reactive ion etch (RIE) the via openings 18A, 18B, and 18C. The DARC layer 16 reduces the effect of light reflection undesirably exposing the photoresist overlayer 20 used for defining via openings 18A, 18B, and 18C. Light reflection (scattering) from, for example, the IMD layer 12 surface, etching stop layer 14B surface, and their respective interfaces, can cause undesired light exposure of the overlying photoresist layer 20 during photolithographic masking and patterning steps in the formation of via openings 18A, 18B, and 18C. As a result, upon development and removal of the exposed photoresist the phenomenon of undercutting (removing photoresist exposed by reflected light at the base of the photoresist layer) will detrimentally affect the design integrity of the manufactured device.

As feature sizes in etching process have become increasingly smaller, photolithographic processes have been required to use photoresist activating light (radiation) of smaller wavelength. Typically a deep ultraviolet (DUV) activating light source with wavelength less than about 250, but more typically, from about 193 nm to about 230 nm is used. Exemplary DUV photoresists used, for example, have included, PMMA and polybutene sulfone.

Many processes use a metal nitride as a DARC (dielectric anti-reflective coating) such as silicon oxynitride (SiON), silicon nitride SiN, or titanium nitride TiN. Typically, the method of choice for depositing these metal nitride layers is a CVD process where for example, a metal-organic precursor together with nitrogen (and oxygen in the case of SiON) is deposited on a substrate surface, to form a metal nitride. Silicon oxynitride DARC, has been widely used for DUV (deep ultraviolet) lithography because of its tunable refractive index and high etch selectivity to resist.

One problem affecting DUV photoresist processes has been the interference of residual nitrogen-containing species with the DUV photoresist. Residual nitrogen-containing contamination is one of the greater concerns in the use or application of metal nitride films such as SiN as etch stops and, for example, silicon oxynitride as a DARC. For example, nitrogen radicals created due to the presence of nitrogen containing species, such as amines, interfere, with chemically amplified resists by neutralizing the acid catalyst, and rendering that portion of the photoresist insoluble in the developer. As a result, residual photoresist may a remain on the edges and walls of features, affecting subsequent etching or metal filling processes and altering design constraints.

Another aspect of advances in semiconductor device processing technology that exacerbates the problem is the increasing use of low-k (low dielectric constant)insulating materials that make up the bulk of a multilayer device. In order to reduce signal delays caused by parasitic effects related to the capacitance of insulating layers, for example, IMD layers, incorporation of low-k materials have become standard practice as semiconductor feature sizes have diminished. Many of the low-k materials are designed with a high degree of porosity to allow the achievement of lower dielectric constants. An exemplary low-k material is, for example, carbon doped silicon dioxide (C-oxide) which has a dielectric of about 3 or lower and density of about 1.3 g/cm$^3$ compared to dielectric constants of about 4.1 and a density of about 2.3 g/cm$^3$ for silicon dioxides (e.g., un-doped TEOS). A shortcoming of porous low-k materials is that they readily absorb and provide diffusion pathways for chemical species.

As a result, amine and nitrogen-containing species remaining in, for example, a SiON DARC, may readily diffuse into an underlying or overlying IMD layer, thereby becoming potentially available for causing interfering effects with a subsequent photoresist process. The contaminating nitrogen-containing species may diffuse back out of the IMD layer during a photoresist process causing residual photoresist to remain after development thereby altering resist profiles by, for example, remaining deposited on feature edges and sidewalls.

There is therefore a need in the semiconductor processing art to develop a method whereby residual nitrogen-containing species in for example, DARC layers, are prevented from diffusing into insulating materials, for example, IMD layers, especially where the IMD layers include a low-k material.

It is therefore an object of the invention to provide a method whereby residual nitrogen-containing species in for example, DARC layers, are blocked from diffusing into insulating materials, for example, IMD layers, especially where the insulating material is a low-k material while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a blocking layer to reduce a diffusion rate of a chemical species thereby improving a photolithographic process.

In a first embodiment according to the present invention, a method if provided for forming a blocking layer in a multilayer semiconductor device for blocking diffusion of a chemical species including the steps of: providing an insulating layer comprising a target surface for forming a metal nitride layer thereon said insulating layer forming a portion of a multilayer semiconductor device; treating the target surface with an RF generated plasma to cause a density increase over a thickness adjacent to and including a target surface sufficient to reduce a diffusion rate of a chemical species therethrough; forming at least one metal nitride layer over the target surface; and, carrying out a photolithographic process wherein the surface of the at least one metal nitride layer is patterned for etching.

In related embodiments, the target surface comprises a silicon oxide. Further, the silicon oxide further comprises a low-k material with a dielectric constant of less than about 3.5. Further yet, the low-k material includes carbon doped silicon dioxide.

In another related embodiment, the at least one metal ergo nitride layer includes an etch stop layer and a dielectric anti-reflectance coating (DARC) layer. Further, the etch stop layer is selected from the group consisting of silicon nitride, silicon oxynitride, and titanium nitride. Further yet, the DARC layer is selected from the group consisting of silicon nitride, silicon oxynitride, and titanium nitride.

In another related embodiment, the photolithographic process comprises photogeneration of a nitrogen containing radical species within a photoresist.

In yet another related embodiment, the density increase comprises a physical process including ions in the RF generated plasma impacting on the target surface. Further, the physical process is carried out prior to a chemical process whereby ions in the RF generated plasma chemically react with the target surface.

In another embodiment, the density increase comprises a chemical process whereby ions in the RF generated plasma chemically react with the target surface. Further, the ions include oxygen ions and the target surface includes silicon oxide whereby oxygen is incorporated into the target surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
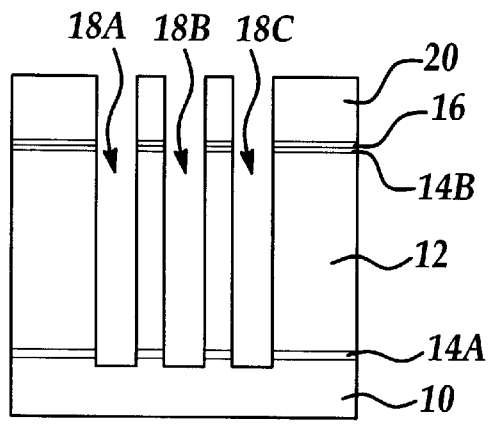
FIG. 1 is a cross-sectional representational view of a portion of a multilayer semiconductor device according to the prior art.
Figure 2:
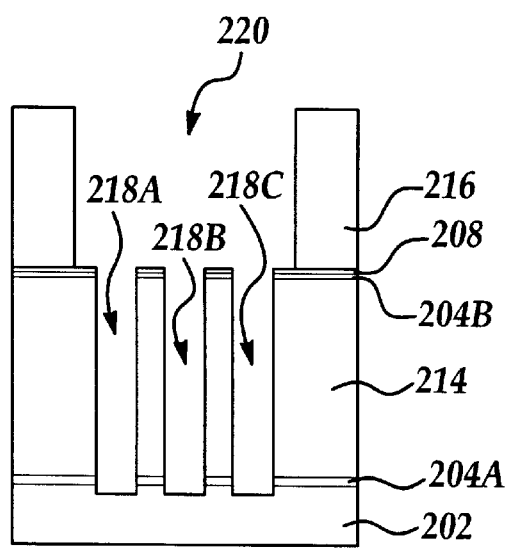
FIG. 2 is a cross-sectional representational view of a portion of a multilayer semiconductor device.

The method and apparatus according to the present invention is more clearly described by referring to FIG. 2.

FIG. 2 is a cross sectional view of a portion of a dual damascene structure showing a trench opening 220 overlying a via openings 218A, 218B, and 218C. Both the trench opening and via openings are, for example, etched by a reactive ion etch (RIE) process into their respective insulating layers. The insulating layer comprising the via openings is herein referred to as an IMD layer 214 and the insulating layer comprising the trench opening defining a metallization line is referred to as a metallization layer 216. Although several different insulating materials may be used in either the IMD layer 214 or the metallization layer 216 including silicon dioxide, preferably a low-k (low dielectric constant material) is used, for example, carbon doped silicon oxide (C-oxide). It will be appreciated that other low-k materials may be used and that the method according to the present invention is likewise applicable to those materials, particularly if they are porous materials. It will also be appreciated that the amount of carbon doping may be varied in both the IMD layer 214 and the metallization layer 216. It will be further appreciated that the present invention is described by reference only to an exemplary portion of a multilayer device comprising multiple IMD and metallization layers, it being understood that the invention applies to the entire multilayer device.

Although there are several different processes that are well known in the art in creating a multiple layer semiconductor device such as, for example, a dual damascene process, a typical process will require at least two photolithographic and etching steps; one for the defining and etching the via openings in the IMD layer 214 and one for defining and etching the trench openings in the metallization layer 216.

In a typical dual damascene process, still with reference to FIG. 2, a barrier layer (etch stop) 204A is formed over an underlying metallization contact, for example, a metallization line 202, for acting as a barrier layer to protect the metallization line 202 and as an etch stop in a subsequent etching process of the overlying IMD layer 214 to form via openings 218A, 218B, and 218C. The etch stop layer 204A is preferably silicon nitride (SiN) or silicon carbide (SiC).

An IMD layer 214 is then formed over the etch stop layer 204A. The silicon nitride layer 204 may be deposited by a PECVD or LPCVD process by reacting silane ($SiH_4$) or an amine-containing metal-organic precursor with ammonia ($NH_3$) or nitrogen under conditions that are well known in the art.

A DARC layer 208 is deposited over the IMD layer to reduce undesired light reflections in a subsequent photolithographic patterning process to define, for example, via openings. Another etch stop layer 204B may be deposited over the IMD layer 214 prior to forming the DARC layer. Preferably, the DARC layer 208 is silicon oxynitride (SiON), but may be other metal nitrides, such as Titanium nitride. The SiON may be deposited by a (chemical vapor deposition (CVD) process including for example, PECVD (plasma enhanced CVD), LPCVD (low pressure CVD), or HDPCVD (high density plasma CVD) by reacting silane ($SiH_4$) or an amine-containing metal-organic precursor with ammonia ($NH_3$) or nitrogen together with oxygen under conditions that are well-known in the art.

In a high density plasma (HDPCVD) process to deposit metal nitrides including SiON, for example, processing conditions may include, any frequency and any combination of RF powers at a range of between 50 watts and about 5,000 watts and at pressure ranges of between about 0.1 mTorr and about 20 mTorr. The bias power for Ar sputtering is between the range of 0 watts and about 4,000 watts. Preferably, $O_2$ gas or, $N_2O$ is used as an oxygen source for the DARC. For example, the $O_2$ gas flow rate during deposition is between about 1 sccm and about 500 sccm, and the $N_2$ flow rate during deposition is between about 1 sccm and about 500 sccm.

Depending on the dual damascene process the via openings may be defined by a photolithographic process and etched in the IMD layer prior to depositing an insulating layer to form the metallization layer. Alternatively, via openings may be defined and etched after forming the metallization layer and etching the trench opening. In either case a photolithographic process whereby photoresist is applied to the surface to be patterned, for example, by spin-coating, an exposed to activating radiation is carried out for patterning both the IMD layer and metallization layer surfaces for etching via openings or trench openings, respectively.

Preferably, a deep ultraviolet (DUV) activating radiation source of less than 250 nm, but more preferably, about 193 nm, is used to expose the photoresist to form the etching pattern. Correspondingly, a DUV photoresist is used for the patterning process. Preferably the photoresist is a chemically amplified resist including a photogenerated acid. There are several suitable commercially available photoresists including for example, PMMA and polybutene sulfone.

Figure 3:
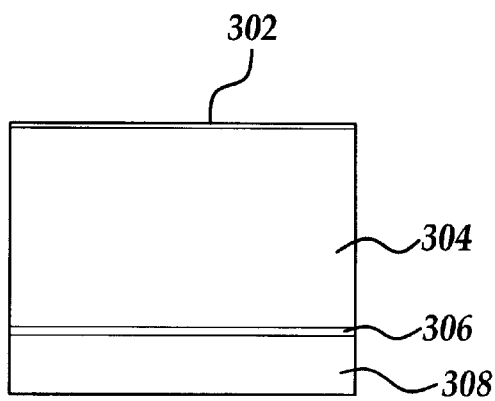
FIG. 3 is a cross-sectional representational view of a portion of a multilayer semiconductor device at a stage in the manufacture of a multilayer semiconductor device according to the present invention.

According to the present invention, referring to FIG. 3 a blocking layer 302 is formed over the insulating layers, for example, the IMD layer 304, prior to forming a DARC layer and patterning and etching the via openings. The IMD layer 304 is again formed over an etch stop layer 306 and a metal contact region in a metallization layer 308. According to the present invention, the blocking layer 302 comprises a densified upper portion of the IMD layer 304 including an insulating material such as, for example, C-oxide. According to the present invention, the surface of the IMD layer material density is increased by an RF generated plasma treatment to form the blocking layer 302. It will be appreciated that the invention as described may apply to the insulating layer including the trench opening 220 in FIG. 2 prior to forming another IMD layer 214 over the metallization layer 216.

In one aspect of the invention, in the plasma surface densification treatment, inert gases such as Ar or He are used and densification occurs by a physical impacting process. The ions making up the plasma increase the density of the upper surface (302 in FIG. 3) of the insulating layer (target surface) exposed to the plasma, for example, the IMD layer, by energy and momentum transferred by the plasma ions impacting the surface of the IMD layer (304 in FIG. 3). Preferably, plasma conditions are such that the insulating material density increases at the surface over a depth of about 10 Angstroms to about 150 Angstroms. For example, the density of C-oxide is preferably increased within a range of about 1.3 $g/cm^3$ to about 2.3 $g/cm^3$. More preferably, the density of the insulating material at the surface is increased by about 10% to about 50% over a depth of about 10 Angstroms to about 150 Angstroms. It will be appreciated that the degree of densification will vary over the depth adjacent to the surface. For example, there is a greater degree of energy and momentum transfer by impacting plasma ions as in that portion of the insulating material closer to the surface The degree of densification will depend on the energy of the plasma and the processing time. Exemplary processing variables include a gas flow rate from about 1 to about 5000 sccm, more preferably, about 500 to about 1500 sccm; a pressure from about 0.1 to about 100 Torr, more preferably, about 1 to about 50 Torr; and an RF power of about 10 to about 5000 Watts, more preferably, from about 500 to about 1000 Watts. Further, a biasing power may be used with a range of about 0 to about 4000 Watts.

According to another aspect of the invention, oxygen may be substituted for the inert gases or combined with them. Preferably the oxygen is combined with inert gases to allow for a greater range of processing pressures. In an oxygen containing plasma, both a physical and chemical densification process may contribute to the densification of the target surface. The oxygen containing plasma initiates a reaction in for example, the C-oxide, to oxidize the target surface by forming silicon dioxide by reaction with, for example, the dangling silicon surface bonds or replacement of residual silicon hydrogen bonds remaining on the target surface after the insulating layer deposition process. In addition, the target surface densification may occur by a physical process whereby energy and momentum is transferred to the target surface by impacting ions generated in the plasma process. Exemplary processing conditions include a gas flow rate from about 1 to about 5000 sccm, more preferably, about 500 to about 1500 sccm; a pressure from about 0.1 to about 100 Torr, more preferably, about 1 to about 50 Torr; and an RF power of about 10 to about 5000 Watts, more preferably, from about 500 to about 1000 Watts. Further, a biasing power may be used with a range of about 0 to about 4000 Watts.

In another aspect of the invention, the target surface is first oxidized by a plasma treatment with an oxygen containing plasma source and then further densified by a plasma treatment with an inert gas source. Alternatively, the target surface may be first densified by a plasma treatment with an inert gas source and then oxidized by a plasma treatment with an oxygen containing plasma source. Preferably, nitrogen containing gases are substantially absent from the plasma gas sources.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a blocking layer in a multilayer semiconductor device for blocking diffusion of a chemical species comprising the steps of:
   providing an insulating layer comprising a target surface for forming a metal nitride layer thereon said insulating layer forming a portion of a multilayer semiconductor device;
   treating the target surface with an RF generated plasma to cause a density increase over a thickness adjacent to and including a target surface sufficient to reduce a diffusion rate of a nitrogen containing chemical species therethrough;
   forming at least one metal nitride layer over the target surface; and
   carrying out a photolithographic process wherein the surface of the at least one metal nitride layer is patterned for etching.

2. The method of claim 1, wherein the target surface comprises a silicon oxide.

3. The method of claim 2, wherein the oxide further comprises a low-k material with a dielectric constant of less than about 3.5.

4. The method of claim 3, wherein the low-k material comprises carbon doped silicon dioxide.

5. The method of claim 1, wherein the at least one metal nitride layer includes an etch stop layer and a dielectric anti-reflectance coating (DARC) layer.

6. The method of claim 5, wherein the etch stop layer is selected from the group consisting of silicon nitride, silicon oxynitride, and titanium nitride.

7. The method of claim 5, wherein the DARC layer is selected from the group consisting of silicon nitride, silicon oxynitride, and titanium nitride.

8. The method of claim 1, wherein the photolithographic process comprises photogeneration of a nitrogen containing radical species within a photoresist.

9. The method of claim 1, wherein the density increase comprises a physical process including ions in the RF generated plasma impacting on the target surface.

10. The method of claim 9, wherein the physical process is carried out prior to a chemical process whereby ions in the RF generated plasma chemically react with the target surface.

11. The method of claim 1, wherein the density increase comprises a chemical process whereby ions in the RF generated plasma chemically react with the target surface.

12. The method of claim 11, wherein the ions include oxygen ions and the target surface includes silicon oxide whereby oxygen is incorporated into the target surface.

13. The method of claim 11, wherein the chemical process is carried out prior to a physical process including ions in the RF generated plasma impacting on the target surface.

14. The method of claim 1, wherein the density increase is within a range of about 10 percent to about 50 percent.

15. The method of claim 1, wherein the density increase occurs over a range of about 10 angstroms to about 150 Angstroms.

16. The method of claim 1, wherein the density increase varies over the thickness from about wherein the density varies over the thickness from about 2.3 g/cm$^3$ to about 1.3 g/cm$^3$.

17. The method of claim 1, wherein the RF generated plasma includes at least one gas source selected from the group consisting of Argon, Helium, Xenon, and oxygen.

18. The method of claim 1, wherein the chemical species is a nitrogen containing species.

19. The method of claim 1, wherein the density increase is carried out under process conditions comprising:
   a gas flow rate from about 1 sccm to about 5000 sccm; a pressure from about 0.1 Torr to about 100 Torr; and
   an RF power of about 10 Watts to about 5000 Watts.

20. The method of claim 1, wherein the density increase is carried out under process conditions comprising:
   a gas flow rate from about 500 sccm to about 1500 sccm;
   a pressure from about 1 Torr to about 50 Torr; and
   an RF power of about 500 Watts to about 1000 Watts.

* * * * *